United States Patent
Hsueh et al.

(10) Patent No.: US 9,966,413 B2
(45) Date of Patent: May 8, 2018

(54) LIGHT-EMITTING DIODE MODULE AND LAMP USING THE SAME

(71) Applicant: LEXTAR ELECTRONICS CORPORATION, Hsinchu (TW)

(72) Inventors: Fang-Chang Hsueh, Taichung (TW); Yu-Min Lin, New Taipei (TW); Chih-Hao Lin, Taipei (TW); Tzong-Liang Tsai, Taichung (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days. days.

(21) Appl. No.: 15/088,616

(22) Filed: Apr. 1, 2016

(65) Prior Publication Data
US 2016/0322420 A1 Nov. 3, 2016

(30) Foreign Application Priority Data

Apr. 29, 2015 (TW) .............................. 104113645 A

(51) Int. Cl.
*H01L 27/15* (2006.01)
*F21K 9/23* (2016.01)
(Continued)

(52) U.S. Cl.
CPC .............. *H01L 27/15* (2013.01); *F21K 9/23* (2016.08); *F21V 3/00* (2013.01); *G02B 6/0073* (2013.01);
(Continued)

(58) Field of Classification Search
CPC ....... H01L 27/15; H01L 33/58; H01L 33/505; H01L 33/36; H01L 33/485;
(Continued)

(56) References Cited

U.S. PATENT DOCUMENTS 7,501,656 B2 * 3/2009 Han .................. H01L 33/58
257/79
8,502,242 B2 * 8/2013 Kim .................. H01L 25/0756
257/103
(Continued)

FOREIGN PATENT DOCUMENTS

EP 2 760 047 7/2014
JP 2008-258334 A 10/2008
(Continued)

OTHER PUBLICATIONS

Taiwan Patent Office, Office Action, Patent Application No. 104113645, dated Jul. 20, 2016, Taiwan.
(Continued)

*Primary Examiner* — Joseph L Williams
*Assistant Examiner* — Jose M Diaz

(57) ABSTRACT

A light-emitting diode (LED) module and a lamp using the same are provided. The LED module includes a substrate and several light-emitting packages. Each light-emitting package includes an optical wavelength conversion layer and a light-emitting diode having a first light-output surface, a bonding surface, and several second light-output surfaces. The bonding surface is opposite the first light-output surface and connected to the substrate. The second light-output surfaces are between the first light-output surface and the bonding surface. The optical wavelength conversion layer covers the first and second light-output surfaces. The distance between the bonding surface and the top surface of the optical wavelength conversion layer represents a light source thickness. The distance between two adjacent light-emitting packages represents a spacing of light sources. Specifically, the ratio of the spacing of light sources to the light source thickness is between 1 and 6.3.

12 Claims, 4 Drawing Sheets

(51) Int. Cl.
*H01L 25/075* (2006.01)
*H01L 33/50* (2010.01)
*F21V 3/00* (2015.01)
*F21V 8/00* (2006.01)
*H01L 33/58* (2010.01)
*F21Y 101/00* (2016.01)
*H01L 33/36* (2010.01)
*F21Y 105/16* (2016.01)
*F21K 9/232* (2016.01)
*F21Y 115/10* (2016.01)
*H01L 33/48* (2010.01)

(52) U.S. Cl.
CPC ........ *H01L 25/0753* (2013.01); *H01L 33/505* (2013.01); *H01L 33/58* (2013.01); *F21K 9/232* (2016.08); *F21Y 2101/00* (2013.01); *F21Y 2105/16* (2016.08); *F21Y 2115/10* (2016.08); *H01L 33/36* (2013.01); *H01L 33/486* (2013.01)

(58) Field of Classification Search
CPC ....... H01L 25/0753; F21K 9/23; F21K 9/232; F21V 3/00; G02B 6/0073; F21Y 2101/00; F21Y 2115/10; F21Y 2105/16
See application file for complete search history.

(56) References Cited

U.S. PATENT DOCUMENTS

| | | | | |
|---|---|---|---|---|
| 9,431,579 | B2* | 8/2016 | Wu | ....................... H01L 33/382 |
| 2009/0115313 | A1 | 5/2009 | Lu et al. | |
| 2013/0257264 | A1* | 10/2013 | Tamaki | ................... B05D 5/06 |
| | | | | 313/503 |
| 2014/0091329 | A1 | 4/2014 | Lee et al. | |
| 2014/0167598 | A1* | 6/2014 | Chen | ..................... H01L 33/505 |
| | | | | 313/498 |
| 2014/0291610 | A1 | 10/2014 | Tseng et al. | |
| 2015/0009710 | A1* | 1/2015 | Kim | ..................... G02B 6/0073 |
| | | | | 362/611 |
| 2015/0129918 | A1* | 5/2015 | Ikegami | ................. H01L 33/54 |
| | | | | 257/98 |
| 2016/0043289 | A1* | 2/2016 | Inomata | ............. C09K 11/7774 |
| | | | | 257/98 |
| 2016/0056143 | A1* | 2/2016 | Park | .................... H01L 27/0248 |
| | | | | 257/91 |
| 2016/0284949 | A1* | 9/2016 | Hagelaar | ............. H01L 25/0753 |
| 2017/0069606 | A1* | 3/2017 | Gould | ................ H01L 25/0753 |
| 2017/0155022 | A1* | 6/2017 | Tomonari | ................ H01L 33/54 |

FOREIGN PATENT DOCUMENTS

| | | |
|---|---|---|
| JP | 2012-84930 A | 4/2012 |
| JP | 2013-183020 A | 9/2013 |
| TW | I254997 | 3/2006 |
| TW | 201130167 | 9/2011 |
| TW | M422645 | 2/2012 |
| TW | 201431114 | 8/2014 |

OTHER PUBLICATIONS

China Patent Office, Office Action, Patent Application No. 201510341193.1, dated Dec. 14, 2017, China.
European Patent Office, Office Action, Patent Application Serial No. 16 167 209.2, dated May 30, 2016, Europe.
European Patent Office, Search Report, Patent Application Serial No. 16 167 209.2, dated Nov. 8, 2017, Europe.
Japan Patent Office, Office Action, Patent Application Serial No. 2016-89919, dated Sep. 5, 2017, Japan.
Japan Patent Office, Office Action, Patent Application Serial No. 2016-89919, dated Dec. 13, 2016, Japan.

* cited by examiner

LIGHT-EMITTING DIODE MODULE AND LAMP USING THE SAME

CROSS REFERENCE TO RELATED APPLICATIONS

The present application claims priority of Taiwan Patent Application No. 104113645, filed on Apr. 29, 2015, the entirety of which is incorporated by reference herein.

BACKGROUND OF THE INVENTION

Field of the Invention

The present application relates to an illumination technology, and in particular to a light-emitting diode (LED) module and a lamp using the same.

Description of the Related Art

Light-emitting diodes (LEDs) have been widely used in lighting applications as they have such advantages as having a long life, high illumination efficiency, small size, and low pollution.

A conventional LED lighting module usually includes a substrate, several LEDs, a phosphor layer and an opaque structure, in which the LEDs are mounted on the substrate by a wire bonding packaging. The phosphor layer covers the LEDs. The opaque structure surrounds the LEDs, so as to define the coating position of the phosphor layer. However, in this conventional LED lighting module, the distribution of the LEDs is usually large, so that the light is diverged from the LEDs of the LED lighting module. In addition, the opaque structure also limits the light-output angle. Therefore, a lamp with this conventional LED lighting module may need various lenses with different specifications to produce the desired optical effect.

Another conventional LED lighting module usually includes a substrate with several LED packages mounted thereon. Each LED package includes a housing made of plastic, an LED received in the housing, and a phosphor layer covering the LED. However, this conventional LED lighting module usually has a poor optical effect due to the high thermal resistance of the LED packages. Moreover, while using a lamp having this conventional LED lighting module, each LED package is individually covered by a lens. In this way, the fabrication cost is increased, and the optical performance is also poor, e.g. blurring may occur.

It is therefore that an LED (lighting) module and a lamp using the same which can improve the disadvantages described above are needed.

BRIEF SUMMARY OF THE INVENTION

An embodiment of the invention provides a light-emitting diode (LED) module including a substrate and a plurality of light-emitting packages. Each light-emitting package includes an optical wavelength conversion layer and a light-emitting diode (LED) having a first light-output surface, a bonding surface, and a plurality of second light-output surfaces. The bonding surface is opposite the first light-output surface and connected to the substrate by a flip-chip packaging. The second light-output surfaces are between and substantially perpendicular to the first light-output surface and the bonding surface. The optical wavelength conversion layer is disposed on the LED and covers the first light-output surface and the second light-output surfaces thereof. The distance between the bonding surface of the LED and the top surface of the optical wavelength conversion layer on the first light-output surface represents a light source thickness. The distance between two adjacent light-emitting packages represents a spacing of light sources. Specifically, the ratio of the spacing of light sources to the light source thickness is between 1 and 6.3.

In some embodiments, the ratio of the spacing of light sources to the light source thickness is between 2 and 3.

In some embodiments, the bonding surface of the LED has a plurality of electrodes thereon, and the substrate has a plurality of bonding pads thereon corresponding to the electrodes, so as to electrically connect the LED and the substrate.

In some embodiments, one of the electrodes of the LED has a first area, and a corresponding bonding pad on the substrate has a second area, wherein the ratio of the first area to the second area is between 0.5 and 2.

In some embodiments, one of the bonding pads on the substrate is shifted with respect to a corresponding electrode of the LED along a horizontal direction by a distance that is less than 50 micrometers.

In some embodiments, the optical wavelength conversion layer on the first light-output surface has a first thickness, and the optical wavelength conversion layer on the second light-output surfaces has a second thickness, wherein the ratio of the first thickness to the second thickness is between 1 and 1.33.

In some embodiments, the LED module further includes a light-guide layer disposed between the light-emitting packages.

In some embodiments, the light-guide layer has a refractive index that is less than that of the optical wavelength conversion layers.

In some embodiments, the light-guide layer has a bottom surface and a second top surface. The bottom surface is opposite the second top surface and connected to the substrate, and the second top surface is a flat surface, a convex curved surface, a concave curved surface, or a serrated surface.

Another embodiment of the invention provides a lamp including a base, a light cover, and a light-emitting diode (LED) module. The light cover is connected to the base to form a receiving space. The LED module is disposed in the receiving space and includes a substrate and a plurality of light-emitting packages. Each light-emitting package includes an optical wavelength conversion layer and a light-emitting diode (LED) having a first light-output surface, a bonding surface, and a plurality of second light-output surfaces. The bonding surface is opposite the first light-output surface and connected to the substrate by a flip-chip packaging. The second light-output surfaces are between and substantially perpendicular to the first light-output surface and the bonding surface. The optical wavelength conversion layer is disposed on the LED and covers the first light-output surface and the second light-output surfaces thereof. The distance between the bonding surface of the LED and the top surface of the optical wavelength conversion layer on the first light-output surface represents a light source thickness. The distance between two adjacent light-emitting packages represents a spacing of light sources. Specifically, the ratio of the spacing of light sources to the light source thickness is between 1 and 6.3.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
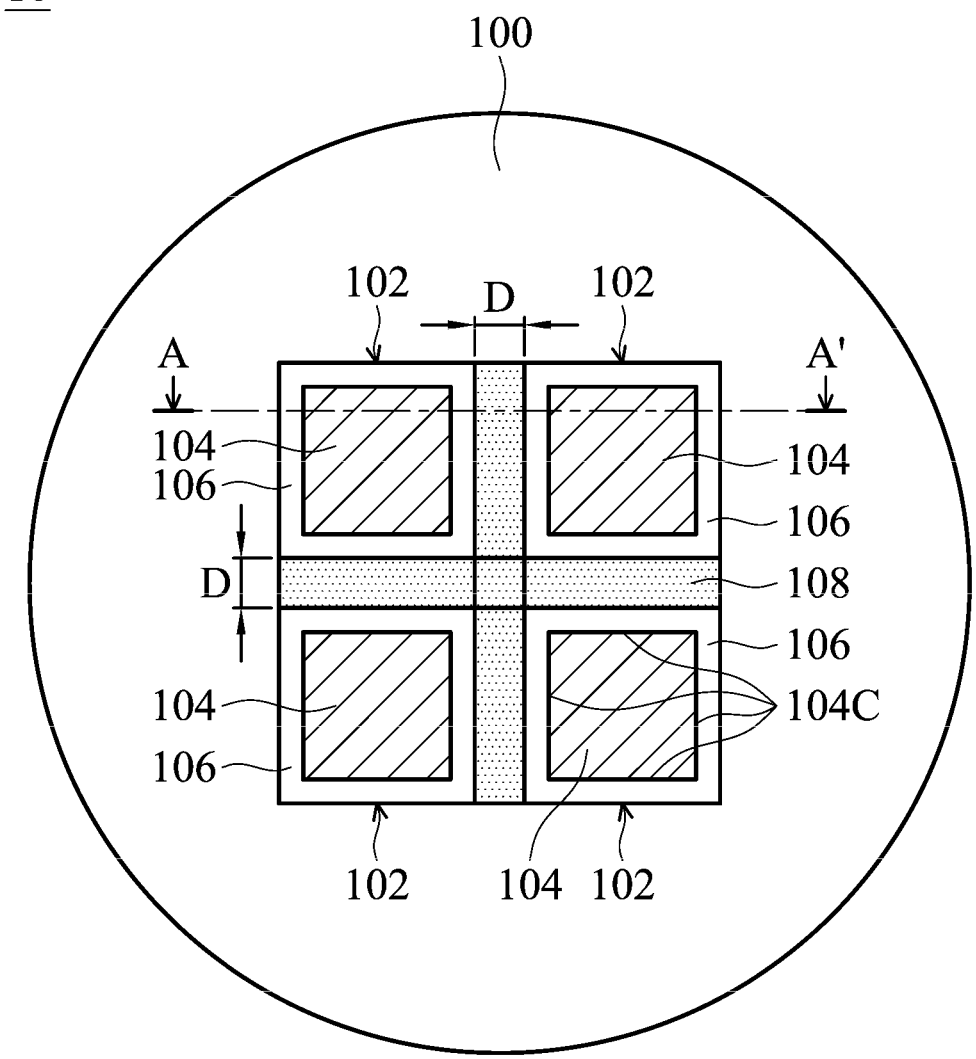
FIG. 1 is a top view of a light-emitting diode (LED) module in accordance with an embodiment of the invention.

In order to illustrate the purposes, features and advantages of the invention, the preferred embodiments and figures of the invention are shown in detail as follows.

In the following detailed description, the orientations of "on", "over", "under", and "below" are used to represent the relationship between the relative positions of each element as illustrated in the drawings, and are not meant to limit the invention. Moreover, the formation of a first element over or on a second element in the description that follows may include embodiments in which the first and second elements are formed in direct contact, or the first and second elements have one or more additional elements formed therebetween.

In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity. Furthermore, some elements not shown or described in the embodiments have the forms known by persons skilled in the field of the invention.

Figure 2:
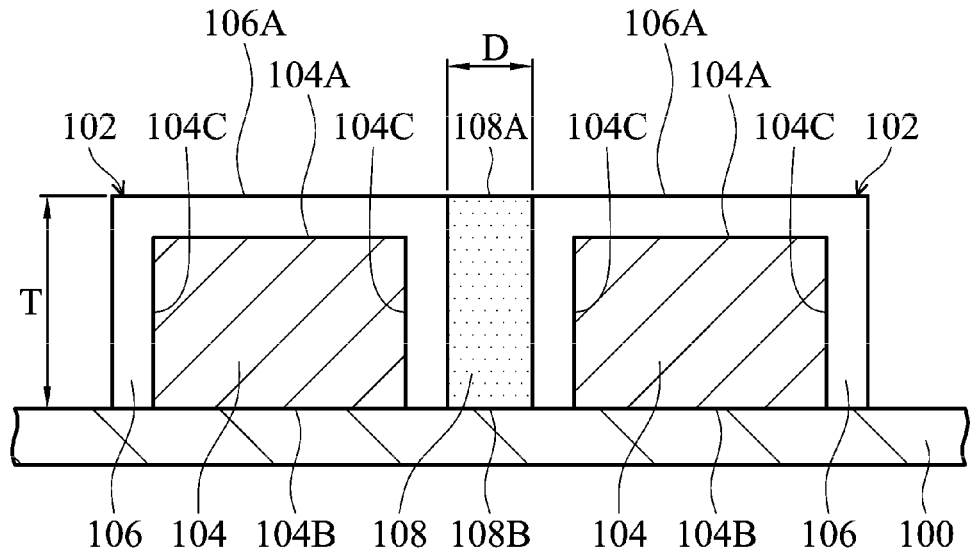
FIG. 2 is a cross-sectional view taken along the line A-A' in FIG. 1.
Figure 3:
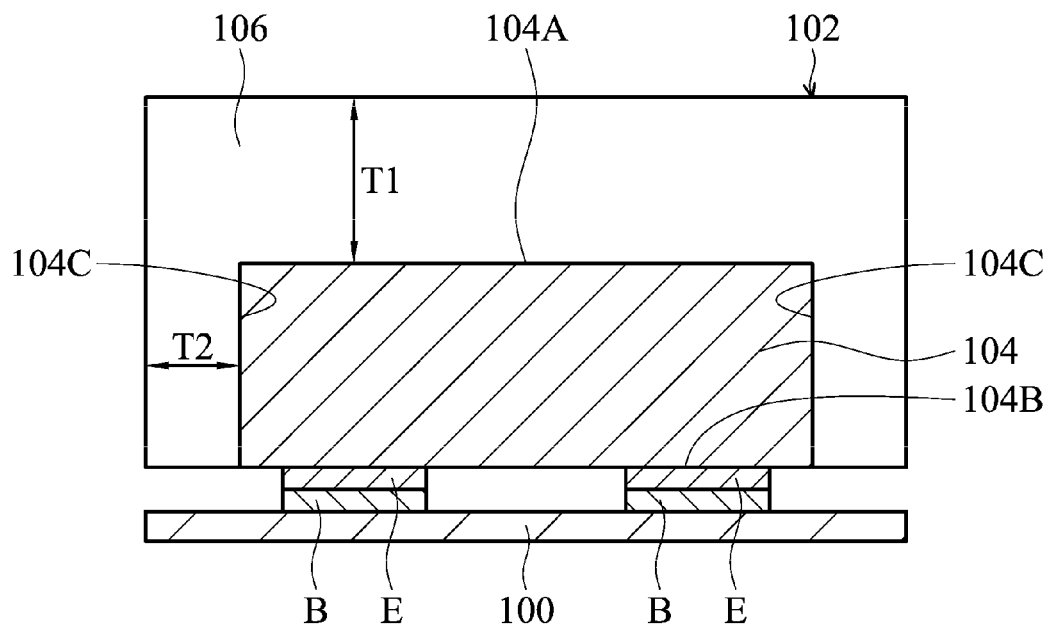
FIG. 3 is an enlarged view illustrating the bonding portions of the light-emitting package and the substrate in FIG. 2.

Referring to FIGS. 1, 2 and 3. FIG. 1 is a top view of a light-emitting diode (LED) module in accordance with an embodiment of the invention. FIG. 2 is a cross-sectional view taken along the line A-A' in FIG. 1. FIG. 3 is an enlarged view illustrating the bonding portions of the light-emitting package and the substrate in FIG. 2. As shown in FIGS. 1 to 3, a light-emitting diode (LED) module 10 according to an embodiment includes a substrate 100, a plurality of light-emitting packages 102, and a light-guide (material) layer 108.

The substrate 100 may be a circuit board and has several wires (not shown) thereon for electrically connecting to the light-emitting packages 102 and providing the driving electric-energy for the light-emitting packages 102. The light-emitting packages 102 are disposed on the substrate 100, and each light-emitting package 102 includes a light-emitting diode (LED) 104 and an optical wavelength conversion layer 106 disposed on the LED 104. In this embodiment, the light-emitting packages 102 can emit white light, and the LED 104 and the optical wavelength conversion layer 106 may be a blue LED and a yellow phosphor layer. However, the invention is not limited to this embodiment. Moreover, the light-guide layer 108 is disposed between adjacent light-emitting packages 102, for guiding light and preventing light absorption between the light-emitting packages 102. The working principle and other features and advantages of the light-guide layer 108 are described further in the following paragraphs.

It should be realized that there are four light-emitting packages 102 arranged in a matrix as shown in FIG. 1, but, there may also be two, three or more light-emitting packages 102 arranged in a matrix or arranged in other ways, in some embodiments of the invention.

Still referring to FIGS. 1, 2, and 3, the LEDs 104 have hexahedral structures, but are not limited here. Specifically, each LED 104 has a first light-output surface 104A, a bonding surface 104B opposite the first light-output surface 104A, and four second light-output surfaces 104C between the first light-output surface 104A and the bonding surface 104B. As shown in FIG. 2, the second light-output surfaces 104C are substantially perpendicular to the first light-output surface 104A and the bonding surface 104B. In addition, the optical wavelength conversion layer 106 covers the first light-output surface 104A and four second light-output surfaces 104C, so that each light-emitting package 102 has five light-output surfaces (except for the bonding surface 104B).

In this embodiment, the optical wavelength conversion layer 106 can be individually formed on each LED 104 by a vacuum mold membrane technology. In this way, the thickness and uniformity of phosphor layer can be precisely controlled so as to improve the illumination efficiency, compared with the prior art which uses a glue dispensing technology to apply a single phosphor layer on several LEDs. As shown in FIG. 3, the optical wavelength conversion layer 106 on the first light-output surface 104A has a first thickness T1, and the optical wavelength conversion layer 106 on the second light-output surfaces 104C has a second thickness T2. In some embodiments, the ratio of the first thickness T1 to the second thickness T2 is between 1 and 1.33, and the light-emitting packages 102 can have better illumination efficiency and color uniformity. Moreover, the LED module 10 as described above eliminates the opaque structure used in prior art, thus increasing the light-output angle.

As shown in FIG. 3, the bonding surface 104B of the LED 104 has a plurality of electrodes E thereon, and the substrate 100 has a plurality of bonding pads B thereon corresponding to the electrodes E. The electrodes E and the bonding pads B may be connected to each other by a metal eutectic bonding technology (but is not limited here), so that the LED 104 and the substrate 100 are electrically connected. In this embodiment, the LED 104 is connected to the substrate 100 by a flip-chip packaging such that the packaging thermal resistance can be significantly reduced and the illumination efficiency of the whole LED module 10 can also be improved.

Figure 4:
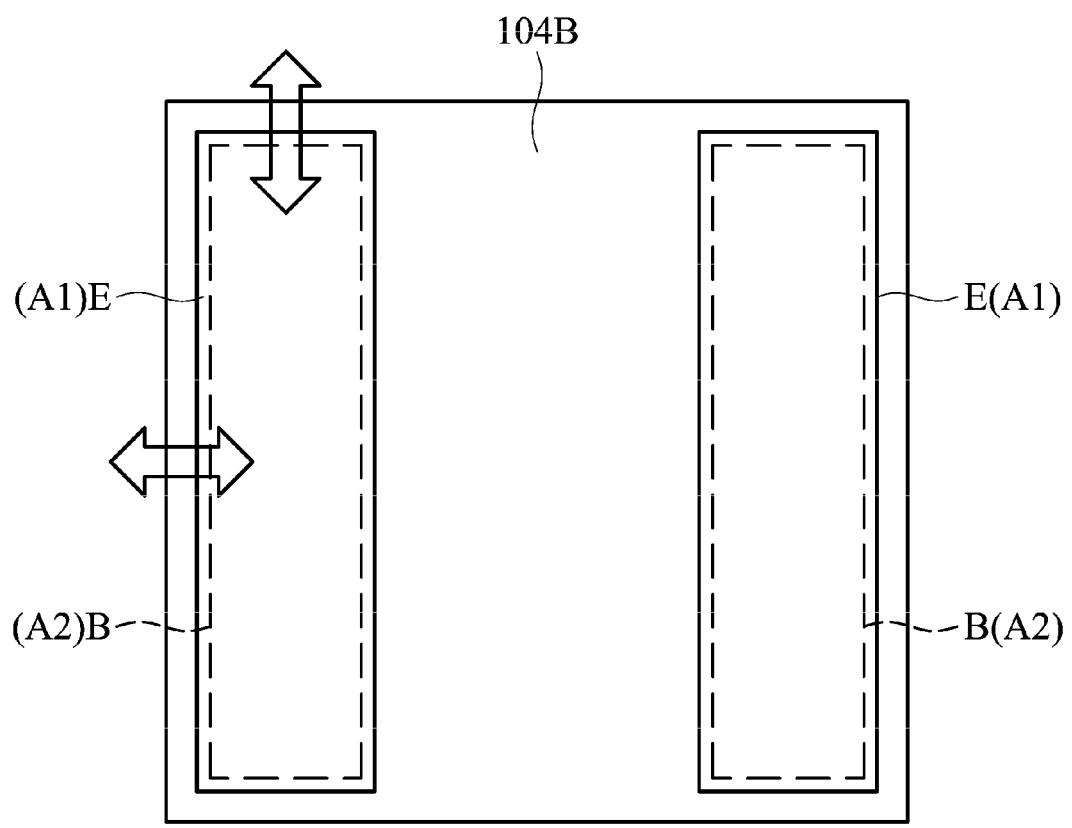
FIG. 4 is a schematic view illustrating the arrangement of the electrodes of the light-emitting diode and the bonding pads on the substrate in FIG. 3.

Referring to FIG. 4, a schematic view illustrating the arrangement of the electrodes E of the LED 104 and the bonding pads B on the substrate 100 in FIG. 3. In this embodiment, the electrodes E on the bonding surface 104B of the LED 104 have a first area A1 (the electrodes E have the same area in this embodiment, but the invention is not limited thereto), and the corresponding bonding pads B (as depicted by dotted lines in FIG. 4) on the substrate 100 have a second area A2, wherein the ratio of the first area A1 to the second area A2 is between 0.5 and 2. Therefore, the light-emitting packages 102 and the substrate 100 have a larger bonding strength, and the light-emitting packages 102 can have a better optical effect.

Specifically, if the ratio of the first area A1 to the second area A2 is greater than 2, the bonding strength of the light-emitting packages 102 and the substrate 100 may be insufficient (i.e. the bonding between the light-emitting packages 102 and the substrate 100 will easily fail); if the ratio of the first area A1 to the second area A2 is less than 0.5, the light emitted from the light-emitting packages 102 may be absorbed by the bonding pads B and thus the illumination efficiency of the light-emitting packages 102 is adversely affected. In a preferred embodiment, the ratio of the first area A1 to the second area A2 is 1, and the bonding pad B is shifted with respect to the corresponding electrode E along a horizontal direction (as the arrow directions indicate in FIG. 4) by a distance that is less than 50 micrometers.

It should be noted that, compared with the prior art utilizing the wire bonding packaging or the plastic housing packaging, the distribution (area) of the light-emitting packages 102 in this embodiment can be effectively reduced by the flip-chip packaging, and the spacing of the light-emitting packages 102 can thus be adjusted easily. Consequently, the desired optical effect is achieved. For example, from FIGS. 1 and 2, the distance between adjacent light-emitting packages 102 (i.e. the distance between adjacent optical wavelength conversion layers 106) is represented by a spacing D of light sources (each light-emitting package 102 is regarded as a point light source), and the distance between the bonding surface 104B of the LED 104 in the light-emitting package 102 and the top surface 106A of the optical wavelength conversion layer 106 on the first light-output surface 104A of the LED 104 is represented by a light source thickness T. The ratio of the spacing D of light sources (about 0.35 to 2.2 millimeters) to the light source thickness T (about 0.35 millimeters) in this embodiment is between 1 and 6.3, and the LED module 10 can thus meet the needs of different (lighting) light-output angles.

Figure 5:
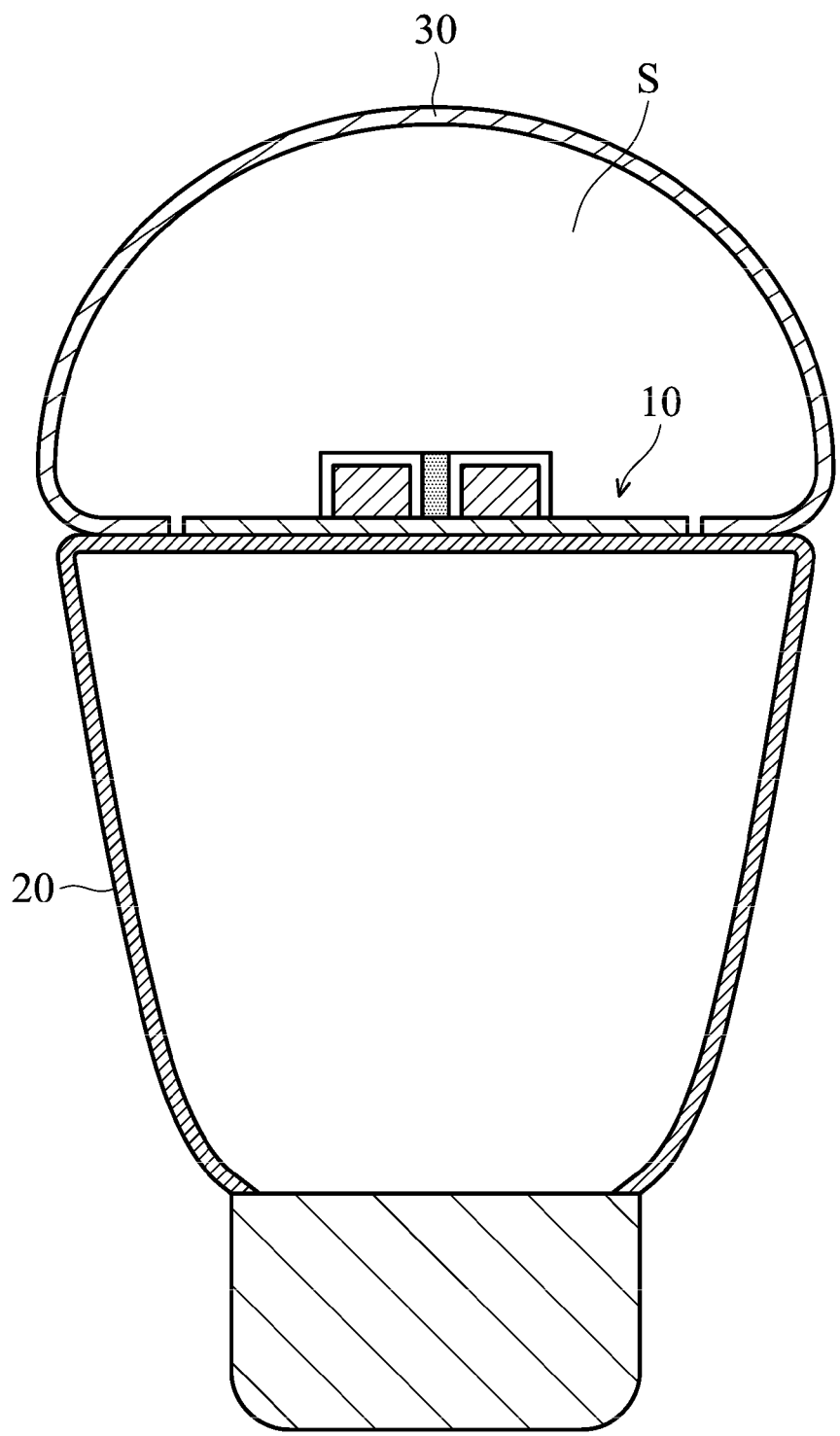
FIG. 5 is a cross-sectional view of a lamp in accordance with an embodiment of the invention.

Another embodiment of the invention also provides a lamp using the LED module 10 described above. Referring to FIG. 5, a lamp according to an embodiment includes an LED module 10 as described above, a base 20, and a light cover 30. Specifically, the light cover 30 may be connected to the base 20 by a way of engagement or locking (not shown), and the light cover 30 and base 20 can form a receiving space S therebetween. The LED module 10 is disposed in the receiving space S and can be supported by the base 20. It should be realized that the design of the base 20 and the light cover 30 is not the point of the invention, and thus the structure and material of the base 20 and the light cover 30 are not described here.

The lamp of this embodiment is characterized by: The less (close to 1) of the ratio of the spacing D of light sources to the light source thickness T of the LED module 10, the light-emitting packages 102 are more likely to mutually absorb light. Thus, the whole luminous flux is reduced, whereas the center beam candlepower (CBCP) is increased. Conversely, the greater (close to 6.3) of the ratio of the spacing D of light sources to the light source thickness T of the LED module 10, the whole luminous flux is increased, whereas the CBCP is reduced. Accordingly, with the point light sources (light-emitting packages 102) having different spacing, the needs of various lighting or lamp specifications can be met by a single light cover 30. In a preferred embodiment, the ratio of the spacing D of light sources to the light source thickness T of the LED module 10 is between 2 and 3. In this way, the desired optical effect with high luminous flux and high CBCP can be obtained simultaneously.

With the design described above, the common usage of the light cover of the lamp, in this embodiment, is achieved, so that the fabrication cost can be effectively reduced. Moreover, since the light from the light-emitting packages 102 of the LED module 10 is transmitted out through a single light cover 30, the optical performance of the lamp is also not adversely affected.

Referring to FIGS. 1 and 2 again, a transparent light-guide layer 108 is further disposed between the light-emitting packages 102. The refractive index of the light-guide layer 108 is less than the refractive index of the optical wavelength conversion layers 106 of the light-emitting packages 102 and is greater than the refractive index of the environment (e.g. air in the receiving space S). With the refractive indices being decreased progressively, the light emitted from the light-emitting packages 102 can be guided upward by the light-guide layer 108 and is transmitted out through the light cover 30, reducing the possibility of light absorption between the light-emitting packages 102. Therefore, the illumination efficiency of the lamp can be improved, and the central dark area occurring from the larger spacing of the light-emitting packages 102 can be prevented (i.e. the light-output uniformity can be improved).

Although the top surface 108A (the second top surface) of the light-guide layer 108 in FIG. 2 is a flat surface, it may also be designed to as a convex curved surface, a concave curved surface, or a serrated surface, depending on the actual requirement. In FIG. 2, the bottom surface 108B of the light-guide layer 108, opposite the top surface 108A, is connected to the substrate 100.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting diode (LED) module, comprising:
a substrate; and
a plurality of light-emitting packages, each of the light-emitting packages including an optical wavelength conversion layer and a light-emitting diode (LED) having a first light-output surface, a bonding surface and a plurality of second light-output surfaces, wherein the bonding surface is opposite the first light-output surface and connected to the substrate by a flip-chip packaging, the second light-output surfaces are between and substantially perpendicular to the first light-output surface and the bonding surface, and the optical wavelength conversion layer is disposed on the LED and covers the first light-output surface and the second light-output surfaces thereof, wherein a distance between the bonding surface of the LED and a top surface of the optical wavelength conversion layer on the first light-output surface represents a light source thickness, and another distance between two adjacent light-emitting packages represents a spacing of light sources, wherein a ratio of the spacing of light sources to the light source thickness is between 1 and 6.3.

2. The LED module as claimed in claim 1, wherein the ratio of the spacing of light sources to the light source thickness is between 2 and 3.

3. The LED module as claimed in claim 1, wherein the bonding surface of the LED has a plurality of electrodes thereon, and the substrate has a plurality of bonding pads thereon corresponding to the electrodes, so as to electrically connect the LED and the substrate.

4. The LED module as claimed in claim 3, wherein one of the electrodes of the LED has a first area, and a corresponding bonding pad on the substrate has a second area, wherein a ratio of the first area to the second area is between 0.5 and 2.

5. The LED module as claimed in claim 3, wherein one of the bonding pads on the substrate is shifted with respect to a corresponding electrode of the LED along a horizontal direction by a distance that is less than 50 micrometers.

6. The LED module as claimed in claim 1, wherein the optical wavelength conversion layer on the first light-output surface has a first thickness, and the optical wavelength conversion layer on the second light-output surfaces has a second thickness, wherein a ratio of the first thickness to the second thickness is between 1 and 1.33.

7. The LED module as claimed in claim 1, further comprising:
a light-guide layer, disposed between the light-emitting packages.

8. The LED module as claimed in claim 7, wherein the light-guide layer has a refractive index that is less than that of the optical wavelength conversion layers.

9. The LED module as claimed in claim 7, wherein the light-guide layer has a bottom surface and a second top surface, the bottom surface is opposite the second top surface and connected to the substrate, and the second top surface is a flat surface, a convex curved surface, a concave curved surface, or a serrated surface.

10. A lamp, comprising:
a base;
a light cover, connected to the base for forming a receiving space; and
a light-emitting diode (LED) module, disposed in the receiving space, comprising:
a substrate; and
a plurality of light-emitting packages, each of the light-emitting packages including an optical wavelength conversion layer and a light-emitting diode (LED) having a first light-output surface, a bonding surface and a plurality of second light-output surfaces, wherein the bonding surface is opposite the first light-output surface and connected to the substrate by a flip-chip packaging, the second light-output surfaces are between and substantially perpendicular to the first light-output surface and the bonding surface, and the optical wavelength conversion layer is disposed on the LED and covers the first light-output surface and the second light-output surfaces, wherein a distance between the bonding surface of the LED and a top surface of the optical wavelength conversion layer on the first light-output surface represents a light source thickness, and another distance between two adjacent light-emitting packages represents a spacing of light sources, wherein a ratio of the spacing of light sources to the light source thickness is between 1 and 6.3.

11. The LED module as claimed in claim 1, further comprising:
a light-guide layer, disposed between the light-emitting packages, wherein the light-guide layer does not extend onto the top surface of the optical wavelength conversion layer of each light-emitting package.

12. The lamp as claimed in claim 10, further comprising:
a light-guide layer, disposed between the light-emitting packages, wherein the light-guide layer does not extend onto the top surface of the optical wavelength conversion layer of each light-emitting package.

* * * * *